United States Patent
Choi

(10) Patent No.: US 11,070,253 B2
(45) Date of Patent: Jul. 20, 2021

(54) NEAR FIELD COMMUNICATION DEVICE AND OPERATING METHOD OF NEAR FIELD COMMUNICATION DEVICE

(71) Applicant: SAMSUNG ELECTRONICS CO., LTD., Suwon-si (KR)

(72) Inventor: Jaehun Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/922,166

(22) Filed: Jul. 7, 2020

(65) Prior Publication Data

US 2021/0159942 A1    May 27, 2021

(30) Foreign Application Priority Data

Nov. 25, 2019    (KR) .................. 10-2019-0152713

(51) Int. Cl.
| | | |
|---|---|---|
| *H04B 5/00* | (2006.01) | |
| *H04L 27/227* | (2006.01) | |
| *H03D 7/16* | (2006.01) | |
| *H03D 3/00* | (2006.01) | |

(52) U.S. Cl.
CPC ........... *H04B 5/0025* (2013.01); *H03D 3/007* (2013.01); *H03D 7/165* (2013.01); *H04L 27/227* (2013.01)

(58) Field of Classification Search
CPC .... H04B 15/00; H04B 5/0056; H04B 5/0025; H04L 27/227; H04L 27/2273
See application file for complete search history.

(56) References Cited

U.S. PATENT DOCUMENTS

| | | | | |
|---|---|---|---|---|
| 5,282,227 A | * | 1/1994 | Crawford | H03D 1/2254 329/307 |
| 5,727,035 A | * | 3/1998 | Hiramatsu | H04L 27/38 375/368 |
| 7,233,629 B2 | | 6/2007 | Auranen | |
| 7,729,455 B2 | | 6/2010 | Mizukami | |
| 8,442,157 B2 | | 5/2013 | Ishikawa et al. | |
| 8,537,907 B2 | | 9/2013 | Sung | |
| 9,536,118 B2 | | 1/2017 | Kang et al. | |

(Continued)

FOREIGN PATENT DOCUMENTS

| | | |
|---|---|---|
| JP | 2012-68932 A | 4/2012 |
| KR | 10-0785863 B1 | 12/2007 |

*Primary Examiner* — Khanh C Tran
(74) *Attorney, Agent, or Firm* — Sughrue Mion, PLLC

(57) ABSTRACT

A near field communication device configured to receive a signal from an antenna and to generate a first in-phase signal and a first quadrature-phase signal by multiplying the signal with a first oscillation signal and a second oscillation signal; a first and second low-pass filter configured to generate a second in-phase signal and a second quadrature-phase signal; a first and second analog-to-digital converter configured to generate a third in-phase signal and a third quadrature-phase signal; a digital signal extractor configured to generate a first signal and a second signal based on the third in-phase signal, the third quadrature-phase signal, a first look-up table, and a second look-up table, select one from among the first signal and the second signal based on a signal pattern, and output the selected one as an extraction signal; and a modem configured to receive the extraction signal and to demodulate the extraction signal.

20 Claims, 14 Drawing Sheets

(56) References Cited

U.S. PATENT DOCUMENTS

| | | | |
|---|---|---|---|
| 10,148,322 B2 | 12/2018 | Zhu et al. | |
| 2003/0091108 A1* | 5/2003 | Tanaka | H04B 1/7077 |
| | | | 375/150 |
| 2007/0080835 A1* | 4/2007 | Maeda | H04B 1/30 |
| | | | 341/120 |
| 2010/0232797 A1* | 9/2010 | Cai | H04L 27/066 |
| | | | 398/79 |
| 2017/0244442 A1* | 8/2017 | Mizokami | H03H 7/0153 |
| 2019/0199561 A1 | 6/2019 | Choi et al. | |
| 2020/0220526 A1* | 7/2020 | Testi | H03H 17/0294 |

\* cited by examiner

FIG. 4

| Sampling Timing | First Timing | Second Timing | Third Timing | Fourth Timing |
|---|---|---|---|---|
| Sampling Timings on Carrier | OS1 OS2 | OS1    OS2 | OS1 OS2 | OS2    OS1 |
| Formulas for Amplitude | $\left(\sqrt{(I)^2+(Q)^2}\right)$ | $\left(\sqrt{(I)^2+(-Q)^2}\right)$ | $\left(\sqrt{(-I)^2+(-Q)^2}\right)$ | $\left(\sqrt{(-I)^2+(Q)^2}\right)$ |
| Biases | Forward Bias | Reverse Bias | Forward Bias | Reverse Bias |

FIG. 8

| ↓Q | 1st Look-up Table | | | | | | | | | | | | | | | |
|---|---|---|---|---|---|---|---|---|---|---|---|---|---|---|---|---|
| 15 | 11 | 12 | 13 | 14 | 14 | 15 | 15 | 15 | 15 | 15 | 15 | 15 | 15 | 15 | 15 | 15 |
| 14 | 7 | 11 | 12 | 13 | 13 | 14 | 14 | 14 | 14 | 14 | 15 | 15 | 15 | 15 | 15 | 15 |
| 13 | 3 | 7 | 10 | 11 | 12 | 13 | 13 | 13 | 13 | 13 | 14 | 14 | 15 | 15 | 15 | 15 |
| 12 | 2 | 4 | 7 | 10 | 11 | 12 | 12 | 12 | 12 | 12 | 13 | 13 | 14 | 15 | 15 | 15 |
| 11 | 1 | 3 | 4 | 7 | 10 | 11 | 11 | 11 | 11 | 11 | 12 | 13 | 13 | 14 | 15 | 15 |
| 10 | 1 | 2 | 3 | 4 | 7 | 9 | 10 | 10 | 10 | 11 | 11 | 12 | 13 | 14 | 15 | 15 |
| 9 | 0 | 1 | 2 | 4 | 5 | 7 | 9 | 9 | 9 | 10 | 11 | 11 | 12 | 13 | 14 | 15 |
| 8 | 0 | 1 | 2 | 3 | 4 | 5 | 6 | 7 | 8 | 9 | 10 | 11 | 12 | 13 | 14 | 15 |
| 7 | 0 | 1 | 2 | 3 | 4 | 5 | 6 | 7 | 8 | 9 | 10 | 11 | 12 | 13 | 14 | 15 |
| 6 | 0 | 1 | 2 | 3 | 4 | 5 | 6 | 6 | 7 | 9 | 10 | 11 | 12 | 13 | 14 | 15 |
| 5 | 0 | 1 | 2 | 3 | 3 | 4 | 5 | 5 | 5 | 7 | 9 | 10 | 12 | 13 | 14 | 15 |
| 4 | 0 | 0 | 1 | 2 | 3 | 3 | 4 | 4 | 4 | 5 | 7 | 10 | 11 | 12 | 13 | 14 |
| 3 | 0 | 0 | 1 | 1 | 2 | 3 | 3 | 3 | 3 | 4 | 4 | 7 | 10 | 11 | 12 | 14 |
| 2 | 0 | 0 | 0 | 1 | 1 | 2 | 2 | 2 | 2 | 2 | 3 | 4 | 7 | 10 | 12 | 13 |
| 1 | 0 | 0 | 0 | 0 | 0 | 1 | 1 | 1 | 1 | 1 | 2 | 3 | 4 | 7 | 11 | 12 |
| 0 | 0 | 0 | 0 | 0 | 0 | 0 | 0 | 0 | 0 | 0 | 1 | 1 | 2 | 3 | 7 | 11 |
| I→ | 0 | 1 | 2 | 3 | 4 | 5 | 6 | 7 | 8 | 9 | 10 | 11 | 12 | 13 | 14 | 15 |

FIG. 9

| ↓Q | 2nd Look-up Table | | | | | | | | | | | | | | | |
|---|---|---|---|---|---|---|---|---|---|---|---|---|---|---|---|---|
| 15 | 0 | 0 | 0 | 0 | 0 | 0 | 0 | 0 | 0 | 0 | 1 | 1 | 2 | 3 | 7 | 11 |
| 14 | 0 | 0 | 0 | 0 | 0 | 1 | 1 | 1 | 1 | 1 | 2 | 3 | 4 | 7 | 11 | 12 |
| 13 | 0 | 0 | 0 | 1 | 1 | 2 | 2 | 2 | 2 | 2 | 3 | 4 | 7 | 10 | 12 | 13 |
| 12 | 0 | 0 | 1 | 1 | 2 | 3 | 3 | 3 | 3 | 4 | 4 | 7 | 10 | 11 | 12 | 14 |
| 11 | 0 | 0 | 1 | 2 | 3 | 3 | 4 | 4 | 4 | 5 | 7 | 10 | 11 | 12 | 13 | 14 |
| 10 | 0 | 1 | 2 | 3 | 3 | 4 | 5 | 5 | 5 | 7 | 9 | 10 | 12 | 13 | 14 | 15 |
| 9 | 0 | 1 | 2 | 3 | 4 | 5 | 6 | 6 | 7 | 9 | 10 | 11 | 12 | 13 | 14 | 15 |
| 8 | 0 | 1 | 2 | 3 | 4 | 5 | 6 | 7 | 8 | 9 | 10 | 11 | 12 | 13 | 14 | 15 |
| 7 | 0 | 1 | 2 | 3 | 4 | 5 | 6 | 7 | 8 | 9 | 10 | 11 | 12 | 13 | 14 | 15 |
| 6 | 0 | 1 | 2 | 4 | 5 | 7 | 9 | 9 | 9 | 10 | 11 | 11 | 12 | 13 | 14 | 15 |
| 5 | 1 | 2 | 3 | 4 | 7 | 9 | 10 | 10 | 10 | 11 | 11 | 12 | 13 | 14 | 15 | 15 |
| 4 | 1 | 3 | 4 | 7 | 10 | 11 | 11 | 11 | 11 | 11 | 12 | 13 | 13 | 14 | 15 | 15 |
| 3 | 2 | 4 | 7 | 10 | 11 | 12 | 12 | 12 | 12 | 12 | 13 | 13 | 14 | 15 | 15 | 15 |
| 2 | 3 | 7 | 10 | 11 | 12 | 13 | 13 | 13 | 13 | 13 | 14 | 14 | 15 | 15 | 15 | 15 |
| 1 | 7 | 11 | 12 | 13 | 13 | 14 | 14 | 14 | 14 | 14 | 15 | 15 | 15 | 15 | 15 | 15 |
| 0 | 11 | 12 | 13 | 14 | 14 | 15 | 15 | 15 | 15 | 15 | 15 | 15 | 15 | 15 | 15 | 15 |
| I→ | 0 | 1 | 2 | 3 | 4 | 5 | 6 | 7 | 8 | 9 | 10 | 11 | 12 | 13 | 14 | 15 |

NEAR FIELD COMMUNICATION DEVICE AND OPERATING METHOD OF NEAR FIELD COMMUNICATION DEVICE

CROSS-REFERENCE TO THE RELATED APPLICATION

This application is based on and claims priority under 35 U.S.C. § 119 to Korean Patent Application No. 10-2019-0152713 filed on Nov. 25, 2019, in the Korean Intellectual Property Office, the disclosure of which is incorporated by reference herein in its entirety.

BACKGROUND

1. Field

The disclosure relates to a communication device, and more particularly, to a near field communication (NFC) device having reduced complexity and implementing a low power and an operating method of the near field communication device.

2. Description of Related Art

An NFC device may exchange data wirelessly at a close distance, for example less than 10 cm. The near field communication device may be set to a reader mode or a card mode. A near field communication device set to the reader mode may receive a wireless signal from a near field communication device set to the card mode and may extract data from the received wireless signal.

The near field communication device may extract an in-phase signal and a quadrature-phase signal from the received wireless signal and may calculate an amplitude and a phase of a signal including data from the in-phase signal and the quadrature-phase signal. Components to calculate an amplitude and a phase may be implemented by using a large analog circuit or may be implemented by using a complicated digital circuit.

The use of the large analog circuit and the complicated digital circuit may cause an increase in the size, costs, and power consumption of the near field communication device. Accordingly, there is a consistent demand for an NFC device having reduced size, costs, and power consumption.

SUMMARY

Embodiments provide a near field communication device having reduced size, costs, and power consumption and an operating method of the near field communication device.

According to an embodiment, a near field communication device includes a matching circuit connected to an antenna, and including at least one from among a capacitor and an inductor; a local oscillator configured to generate a first oscillation signal and a second oscillation signal that is 90 degrees out of phase with the first oscillation signal; a first mixer configured to receive a signal from the antenna through the matching circuit, to receive the first oscillation signal from the local oscillator, and to generate a first in-phase signal by multiplying the signal with the first oscillation signal; a second mixer configured to receive the signal from the antenna through the matching circuit, to receive the second oscillation signal from the local oscillator, and to generate a first quadrature-phase signal by multiplying the signal with the second oscillation signal; a first low-pass filter configured to generate a second in-phase signal by filtering the first in-phase signal; a second low-pass filter configured to generate a second quadrature-phase signal by filtering the first quadrature-phase signal; a first analog-to-digital converter configured to generate a third in-phase signal by converting the second in-phase signal; a second analog-to-digital converter configured to generate a third quadrature-phase signal by converting the second quadrature-phase signal; a digital signal extractor configured to: receive the third in-phase signal and the third quadrature-phase signal, generate a first signal based on the third in-phase signal and the third quadrature-phase signal with reference to a first look-up table, and generate a second signal based on the third in-phase signal and the third quadrature-phase signal with reference to a second look-up table, select one from among the first signal and the second signal based on a comparison between the first signal and a signal pattern, and a comparison between the second signal and the signal pattern, and output the selected one from among the first signal and the second signal as an extraction signal; and a modem configured to receive the extraction signal and to demodulate the extraction signal.

According to an embodiment, a near field communication device includes an antenna; a matching circuit connected to the antenna, and including at least one capacitor and at least one inductor; a local oscillator configured to generate a first oscillation signal, and a second oscillation signal that is 90 degrees out of phase with the first oscillation signal; a first mixer configured to receive a signal from the antenna and the matching circuit, to receive the first oscillation signal from the local oscillator, and to generate a first in-phase signal by multiplying the signal with the first oscillation signal; a second mixer configured to receive the signal from the antenna and the matching circuit, to receive the second oscillation signal from the local oscillator, and to generate a first quadrature-phase signal by multiplying the signal with the second oscillation signal; a first low-pass filter configured to generate a second in-phase signal by filtering the first in-phase signal; a second low-pass filter configured to generate a second quadrature-phase signal by filtering the first quadrature-phase signal; a first analog-to-digital converter configured to generate a third in-phase signal by converting the second in-phase signal; a second analog-to-digital converter configured to generate a third quadrature-phase signal by converting the second quadrature-phase signal; a digital signal extractor configured to: receive the third in-phase signal and the third quadrature-phase signal, select one from among the third in-phase signal and the third quadrature-phase signal based on a comparison between the third in-phase signal and a signal pattern, and a comparison between the third quadrature-phase signal and the signal pattern, and output the selected one from among the third in-phase signal and the third quadrature-phase signal as an extraction signal; and a modem configured to receive the extraction signal and to demodulate the extraction signal.

According to an embodiment, an operating method of a near field communication device includes generating an in-phase signal and a quadrature-phase signal from a wireless frequency signal; generating a first digital value corresponding to an amplitude of the in-phase signal, and a second digital value corresponding to an amplitude of the quadrature-phase signal; generating a first signal and a second signal corresponding to an amplitude of the wireless frequency signal based on the amplitude of the in-phase signal and the amplitude of the quadrature-phase signal; selecting one from among the first signal and the second signal based on a comparison between the first signal and a signal pattern, and a comparison between the second signal and the signal pattern; and demodulating the selected one from among the first signal and the second signal.

BRIEF DESCRIPTION OF THE FIGURES

The above and other objects and features of the inventive concept will become apparent by describing in detail exemplary embodiments thereof with reference to the accompanying drawings.

FIG. 4 illustrates tendencies when an amplitude is calculated depending on a timing when a second in-phase signal and a second quadrature-phase signal are sampled, according to an embodiment.

FIG. 8 illustrates an example of a first look-up table, according to an embodiment.

FIG. 9 illustrates an example of a second look-up table, according to an embodiment.

DETAILED DESCRIPTION

Below, embodiments may be described in detail and clearly to such an extent that an ordinary one in the art easily implements the inventive concept. The embodiments described herebelow are all exemplary, and thus, the inventive concept is not limited to these embodiments disclosed below and may be realized in various other forms.

Figure 1:
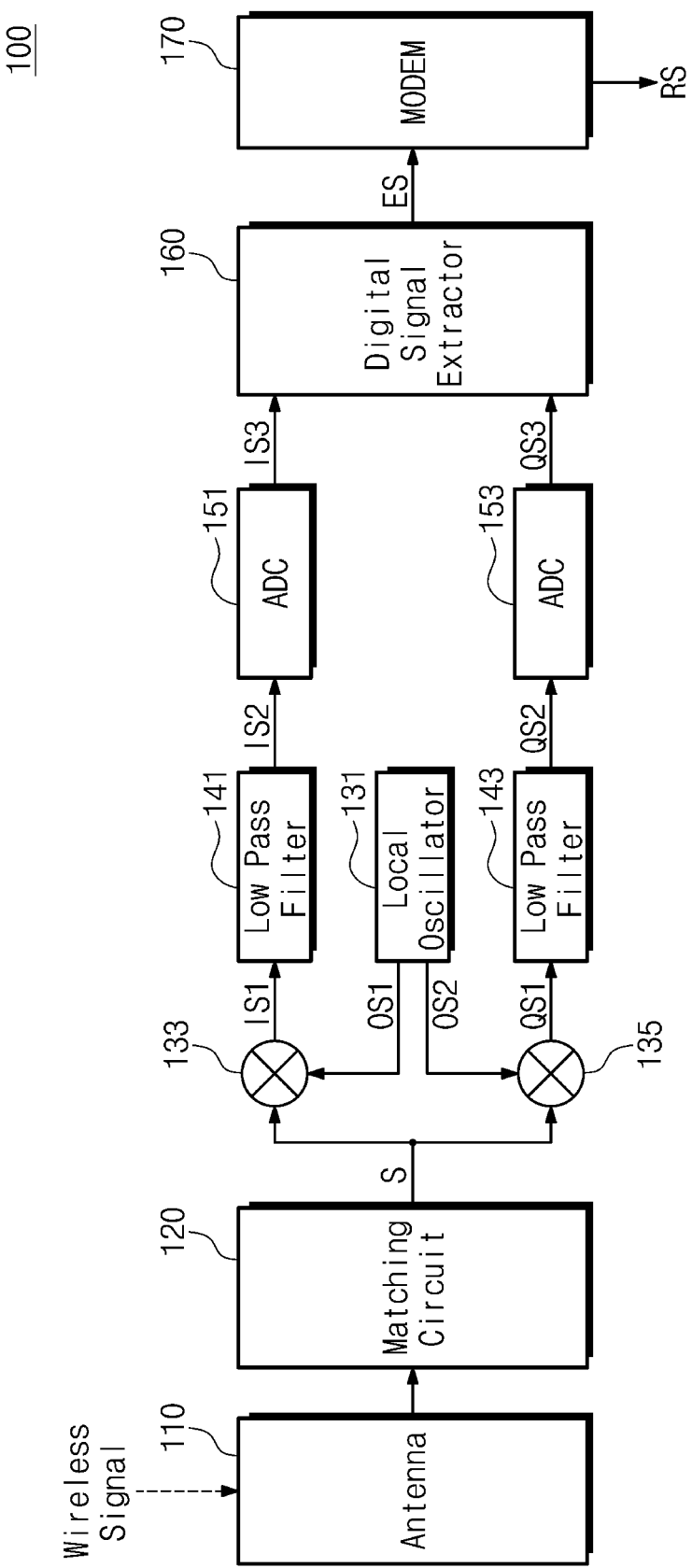
FIG. 1 illustrates a near field communication device, according to an embodiment.

FIG. 1 illustrates a near field communication (NFC) device 100 according to an embodiment. Referring to FIG. 1, the NFC device 100 may include an antenna 110, a matching circuit 120, a local oscillator 131, a first mixer 133, a second mixer 135, a first low pass filter (LPF) 141, a second low pass filter 143, a first analog-to-digital converter (ADC) 151, a second analog-to-digital converter 153, a digital signal extractor 160, and a modem 170.

The antenna 110 may receive a wireless signal from an external device, for example, an NFC device set to, or operating in, a card mode. The matching circuit 120 may provide impedance matching of the antenna 110. The matching circuit 120 may include at least one capacitor, at least one inductor, or a combination of at least one capacitor and at least one inductor.

The antenna 110 and the matching circuit 120 may receive the wireless signal and may output a signal "S". The signal "S" may include a carrier having a frequency of 13.56 MHz defined by the NFC protocol, a subcarrier having a frequency of 847 KHz, 212 KHz, or 424 KHz defined by the NFC protocol, and a baseband data signal.

The local oscillator 131 may generate a first oscillation signal OS1 and a second oscillation signal OS2. The first oscillation signal OS1 and the second oscillation signal OS2 may have a frequency of the carrier according to the NFC protocol, for example, a frequency of 13.56 MHz. The first oscillation signal OS1 and the second oscillation signal OS2 may be 90 degrees out of phase.

The first mixer 133 may receive the signal "S" from the matching circuit 120 and may receive the first oscillation signal OS1 from the local oscillator 131. The first mixer 133 may mix, or for example multiply, the signal "S" and the first oscillation signal OS1 and may output a first in-phase signal IS1.

The first in-phase signal IS1 may include a signal that is generated by removing the carrier from the signal "S", and that may be an in-phase element of a subcarrier and a data signal. The first in-phase signal IS1 may further include harmonics of the in-phase element of the subcarrier and the data signal.

The second mixer 135 may receive the signal "S" from the matching circuit 120 and may receive the second oscillation signal OS2 from the local oscillator 131. The second mixer 135 may mix, or for example multiply, the signal "S" and the second oscillation signal OS2 and may output a first quadrature-phase signal QS1.

The first quadrature-phase signal QS1 may include a signal that is generated by removing the carrier from the signal "S", and that may be a quadrature-phase element of the subcarrier and the data signal. The first quadrature-phase signal QS1 may further include harmonics of the quadrature-phase element of the subcarrier and the data signal.

The first LPF 141 may reject the harmonics from the first in-phase signal IS1 and may output a second in-phase signal IS2. The second in-phase signal IS2 may include the in-phase element of the subcarrier and data signal.

The second LPF 143 may reject the harmonics from the first quadrature-phase signal QS1 and may output a second quadrature-phase signal QS2. The second quadrature-phase signal QS2 may include the quadrature-phase element of the subcarrier and data signal.

The first ADC 151 may digitize the second in-phase signal IS2 and may output a third in-phase signal IS3. For example, the first ADC 151 may have a 4-bit resolution. The third in-phase signal IS3 may include four bit values that indicate the in-phase element of the subcarrier and data signal and vary over time.

The second ADC 153 may digitize the second quadrature-phase signal QS2 and may output a third quadrature-phase signal QS3. For example, the second ADC 153 may have a 4-bit resolution. The third quadrature-phase signal QS3 may include four bit values that indicate the quadrature-phase element of the subcarrier and data signal and vary over time.

The digital signal extractor 160 may receive the third in-phase signal IS3 and the third quadrature-phase signal QS3. The digital signal extractor 160 may extract an extraction signal ES, which is capable of being demodulated according to the NFC protocol, from the third in-phase signal IS3 and the third quadrature-phase signal QS3. The extraction signal ES may include digital values that indicate the subcarrier and data signal and vary over time. The digital signal extractor 160 may be implemented with full digital circuits.

The modem 170 may receive the extraction signal ES from the digital signal extractor 160. The modem 170 may perform NFC protocol-based demodulation on the extraction signal ES. For example, the modem 170 may multiply the extraction signal ES and the subcarrier together and may apply a result of the multiplication to an LPF. The modem 170 may output a receive signal RS as a result of the demodulation.

For example, the receive signal RS may be output to logic such as an application processor or a central processing unit or to logic designed to control the NFC. For another example, the receive signal RS may be output to a memory.

In an embodiment, the NFC device 100 illustrated in FIG. 1 may show only components necessary to receive a wireless signal in the reader mode. The NFC device 100 may further include components for transmitting a wireless signal in the reader mode and components for operating in the card mode. At least one or more of the components illustrated in FIG. 1 may be shared and used to transmit a wireless signal in the reader mode or may be shared and used in the card mode.

Figure 2:
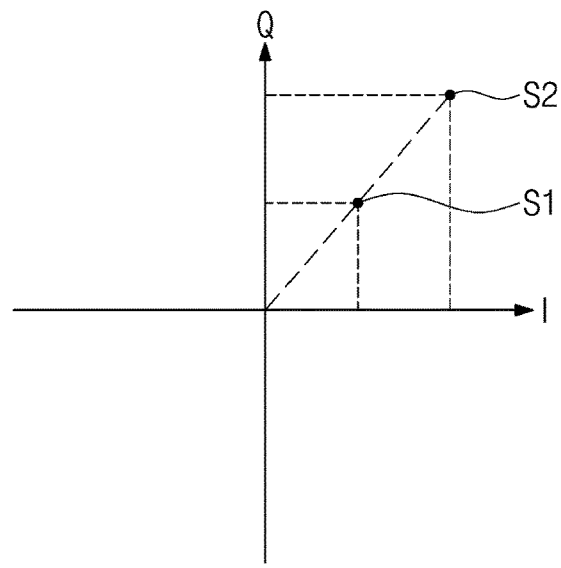
FIG. 2 illustrates an example of a second in-phase signal or a second quadrature-phase signal, according to an embodiment.

FIG. 2 illustrates an example of the second in-phase signal IS2 or the second quadrature-phase signal QS2. Referring to FIGS. 1 and 2, when the second in-phase signal IS2 or the second quadrature-phase signal QS2 is sampled at a specific time, the second in-phase signal IS2 or the second quadrature-phase signal QS2 may be expressed by an amplitude and a phase on a plane defined by an in-phase axis "I" and a quadrature-phase axis "Q".

Because the NFC protocol is based on amplitude shift keying (ASK), the second in-phase signal IS2 or the second quadrature-phase signal QS2 may be one of a first signal 51 having a first amplitude or a second signal S2 having a second amplitude. That is, the second in-phase signal IS2 or the second quadrature-phase signal QS2 may rotate at a frequency of a subcarrier and may have an amplitude varying depending on a period and a value of a data signal.

In general, carrier demodulation may include a procedure of extracting in-phase and quadrature-phase signals (e.g., the second in-phase signal IS2 and the second quadrature-phase signal QS2) and detecting an amplitude and a phase from the in-phase signals and the quadrature-phase signals. The amplitude detection may include a square operation and a root operation. The phase detection may include an arctangent operation.

When the above operations are implemented with analog circuits, relatively large-sized analog circuits may be required compared to digital circuits. Also, when the above operations are implemented with digital circuits, the size, complexity, and power consumption of the digital circuits may increase.

The NFC uses a subcarrier defined by the NFC protocol. Also, the NFC is based on the amplitude shift keying (ASK) adjusting an amplitude of a subcarrier. The NFC device 100 according to an embodiment may be configured to detect the variations in the amplitude of the second in-phase signal IS2 or the second quadrature-phase signal QS2, to determine whether the variations in the amplitude coincide with the subcarrier defined by the NFC protocol, and to select a coinciding signal as the extraction signal ES.

As the second in-phase signal IS2 or the second quadrature-phase signal QS2 is processed to such an extent as to determine whether they coincide with a pattern of the subcarrier without the complicated procedure of calculating an amplitude and a phase, the size, complexity, and costs of the digital signal extractor 160 and the NFC device 100 may decrease, and power consumption may further decrease.

Figure 3:
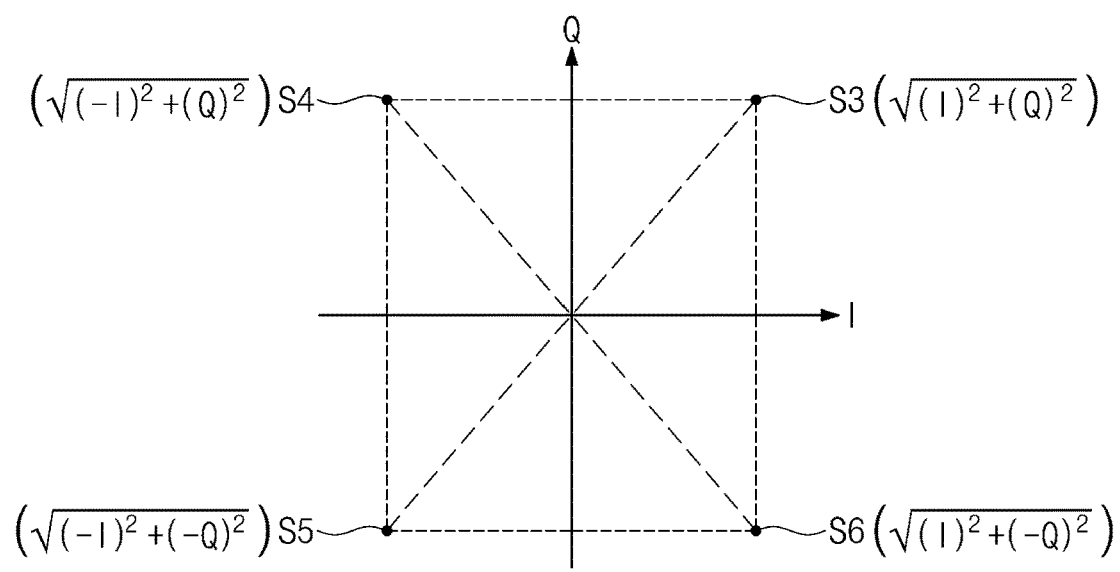
FIG. 3 illustrates a mathematical example of calculating an amplitude depending on a sampling timing of a second in-phase signal and a second quadrature-phase signal, according to an embodiment.

FIG. 3 illustrates a mathematical example of calculating an amplitude by using the second in-phase signal IS2 and the second quadrature-phase signal QS2 depending on a sampling timing of the first mixer 133 and the second mixer 135. Below, embodiments will be described with reference to the second in-phase signal IS2 and the second quadrature-phase signal QS2, but the same detailed description may be applied to the third in-phase signal IS3 and the third quadrature-phase signal QS3.

In an embodiment, sampling includes an operation in which the first mixer 133 multiplies the signal "S" and the first oscillation signal OS1 together and an operation in which the second mixer 135 multiplies the signal "S" and the second oscillation signal OS2 together.

When the signal "S" is a third signal S3 belonging to the first quadrant at the sampling timing, the second in-phase signal IS2 and the second quadrature-phase signal QS2 may have a phase corresponding to the first quadrant and may rotate at the frequency of the subcarrier.

Amplitude calculation using the second in-phase signal IS2 and the second quadrature-phase signal QS2 may be made by Equation 1 below. In Equation 1 below, "I" represents a magnitude of an in-phase element, that is, an amplitude of the second in-phase signal IS2, and "Q" represents a magnitude of an quadrature-phase element, that is, an amplitude of the second quadrature-phase signal QS2. When an amplitude of the third signal S3 increase, both the amplitude of the second in-phase signal IS2 and the amplitude of the second quadrature-phase signal QS2 may increase (e.g., to more positive values). When the amplitude of the third signal S3 decrease, both the amplitude of the second in-phase signal IS2 and the amplitude of the second quadrature-phase signal QS2 may decrease (e.g., to less positive values). That is, the amplitude of the second in-phase signal IS2 and the amplitude of the second quadrature-phase signal QS2 are proportional.

$$\sqrt{I^2+Q^2} \qquad \text{[Equation 1]}$$

When the signal "S" is a fourth signal S4 belonging to the second quadrant at the sampling timing, the second in-phase signal IS2 and the second quadrature-phase signal QS2 may have a phase corresponding to the second quadrant and may rotate at the frequency of the subcarrier. Amplitude calculation using the second in-phase signal IS2 and the second quadrature-phase signal QS2 may be made by Equation 2 below. When an amplitude of the fourth signal S4 increase, the amplitude of the second in-phase signal IS2 may decrease (e.g., to more negative value) and the amplitude of the second quadrature-phase signal QS2 may increase (e.g., to more positive value). When the amplitude of the fourth signal S4 decrease, the amplitude of the second in-phase signal IS2 may increase (e.g., to less negative value) and the amplitude of the second quadrature-phase signal QS2 may decrease (to less positive value). That is, the amplitude of the second in-phase signal IS2 and the amplitude of the second quadrature-phase signal QS2 are reversely proportional.

$$\sqrt{(-I)^2+Q^2}$$ [Equation 2]

When the signal "S" is a fifth signal 55 belonging to the third quadrant at the sampling timing, the second in-phase signal IS2 and the second quadrature-phase signal QS2 may have a phase corresponding to the third quadrant and may rotate at the frequency of the subcarrier. Amplitude calculation using the second in-phase signal IS2 and the second quadrature-phase signal QS2 may be made by Equation 3 below. When an amplitude of the fifth signal 55 increase, both the amplitude of the second in-phase signal IS2 and the amplitude of the second quadrature-phase signal QS2 may decrease (e.g., to more negative values). When the amplitude of the fifth third signal 55 decrease, both the amplitude of the second in-phase signal IS2 and the amplitude of the second quadrature-phase signal QS2 may increase (e.g., to less negative values). That is, the amplitude of the second in-phase signal IS2 and the amplitude of the second quadrature-phase signal QS2 are proportional.

$$\sqrt{(-I)^2+(-Q)^2}$$ [Equation 3]

When the signal "S" is a sixth signal S6 belonging to the fourth quadrant at the sampling timing, the second in-phase signal IS2 and the second quadrature-phase signal QS2 may have a phase corresponding to the fourth quadrant and may rotate at the frequency of the subcarrier. Amplitude calculation using the second in-phase signal IS2 and the second quadrature-phase signal QS2 may be made by Equation 4 below. When an amplitude of the sixth signal S6 increase, the amplitude of the second in-phase signal IS2 may increase (e.g., to more positive value) and the amplitude of the second quadrature-phase signal QS2 may decrease (e.g., to more negative value). When the amplitude of the sixth signal S6 decrease, the amplitude of the second in-phase signal IS2 may decrease (e.g., to less positive value) and the amplitude of the second quadrature-phase signal QS2 may increase (to less negative value). That is, the amplitude of the second in-phase signal IS2 and the amplitude of the second quadrature-phase signal QS2 are reversely proportional.

$$\sqrt{(I)^2+(-Q)^2}$$ [Equation 4]

As understood from Equation 1 to Equation 4 above, Equation for calculating an amplitude by using the second in-phase signal IS2 and the second quadrature-phase signal QS2 may vary depending on a timing when the signal "S" is sampled.

FIG. 4 illustrates tendencies when an amplitude is calculated depending on a timing when the second in-phase signal IS2 and the second quadrature-phase signal QS2 are sampled. Sampling timings of a carrier signal will be described with reference to FIGS. 1 and 4. Below, embodiments will be described with reference to the second in-phase signal IS2 and the second quadrature-phase signal QS2, but the same detailed description may be applied to the third in-phase signal IS3 and the third quadrature-phase signal QS3.

According to a first timing, the first oscillation signal OS1 may be advanced with respect to the second oscillation signal OS2 as much as 90 degrees. The signal "S" may be sampled in the first quadrant. The first oscillation signal OS1 and the second oscillation signal OS2 may be multiplied by the signal "S" when carriers are positive. Amplitude calculation using the second in-phase signal IS2 and the second quadrature-phase signal QS2 may be made by Equation 1 above.

According to a second timing, the first oscillation signal OS1 may be advanced with respect to the second oscillation signal OS2 as much as 90 degrees. The signal "S" may be sampled in the second quadrant. The first oscillation signal OS1 may be multiplied by the signal "S" when a carrier is positive, and the second oscillation signal OS2 may be multiplied by the signal "S" when a carrier is negative. Amplitude calculation using the second in-phase signal IS2 and the second quadrature-phase signal QS2 may be made by Equation 2 above.

According to a third timing, the first oscillation signal OS1 may be advanced with respect to the second oscillation signal OS2 as much as 90 degrees. The signal "S" may be sampled in the third quadrant. The first oscillation signal OS1 and the second oscillation signal OS2 may be multiplied by the signal "S" when carriers are negative. Amplitude calculation using the second in-phase signal IS2 and the second quadrature-phase signal QS2 may be made by Equation 3 above.

According to a fourth timing, the first oscillation signal OS1 may be delayed with respect to the second oscillation signal OS2 as much as 90 degrees. The signal "S" may be sampled in the fourth quadrant. The first oscillation signal OS1 may be multiplied by the signal "S" when a carrier is negative, and the second oscillation signal OS2 may be multiplied by the signal "S" when a carrier is positive. Amplitude calculation using the second in-phase signal IS2 and the second quadrature-phase signal QS2 may be made by Equation 4 above.

Figure 5:
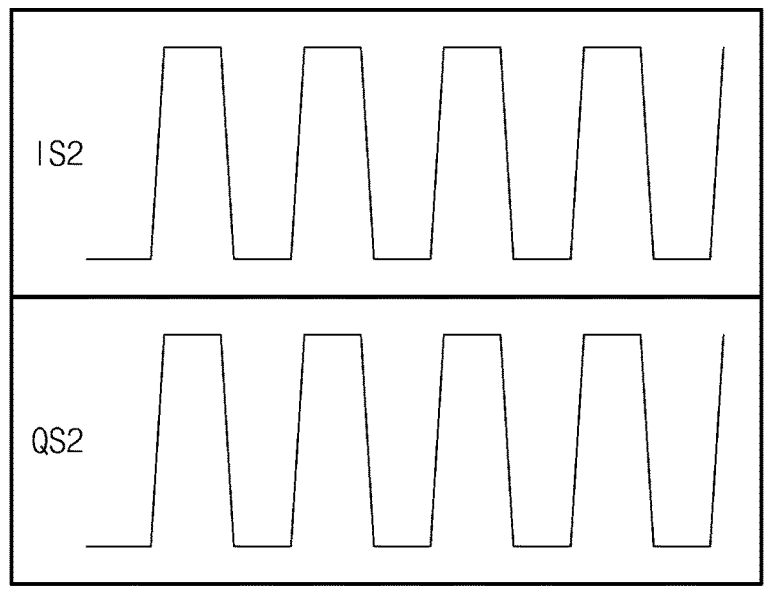
FIG. 5 illustrates an example of waveforms of a second in-phase signal and a second quadrature-phase signal in the case of a forward bias, according to an embodiment.

Referring to the first timing and the third timing, the second in-phase signal IS2 and the second quadrature-phase signal QS2 have the same polarity. The first timing and the third timing may be a forward bias. In the forward bias, the second in-phase signal IS2 and the second quadrature-phase signal QS2 have the same waveform. FIG. 5 illustrates an example of waveforms of the second in-phase signal IS2 and the second quadrature-phase signal QS2 in the case of a forward bias.

Referring to FIG. 5, as a value of the second in-phase signal IS2 increases, a value of the second quadrature-phase signal QS2 increases. As a value of the second in-phase signal IS2 decreases, a value of the second quadrature-phase signal QS2 decreases. A calculation result of Equation 1 or Equation 3 according to a value of the second in-phase signal IS2 and a value of the second quadrature-phase signal QS2 may be implemented with a look-up table. An amplitude of a subcarrier and data signal may be simply obtained with reference to a value of the second in-phase signal IS2, a value of the second quadrature-phase signal QS2, and the look-up table.

Figure 6:
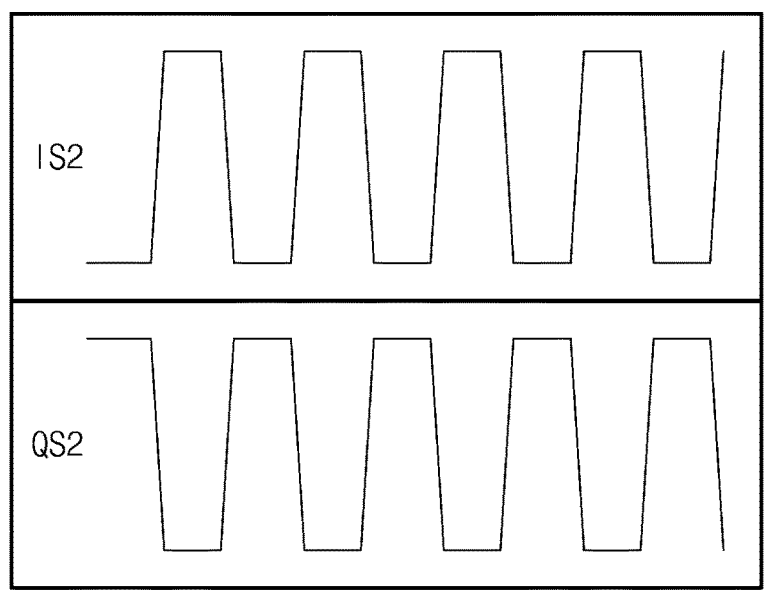
FIG. 6 illustrates an example of waveforms of a second in-phase signal and a second quadrature-phase signal in the case of a reverse bias, according to an embodiment.

Returning to FIGS. 1 and 4, in the second timing and the fourth timing, the second in-phase signal IS2 and the second quadrature-phase signal QS2 have opposite polarities. The second timing and the fourth timing may be a reverse bias. In the reverse bias, the second in-phase signal IS2 and the second quadrature-phase signal QS2 have opposite waveforms. FIG. 6 illustrates an example of waveforms of the second in-phase signal IS2 and the second quadrature-phase signal QS2 in the case of a reverse bias.

Referring to FIG. 6, as a value of the second in-phase signal IS2 increases, a value of the second quadrature-phase signal QS2 decreases. As a value of the second in-phase signal IS2 decreases, a value of the second quadrature-phase signal QS2 increases. A tendency of a change in a value of the second quadrature-phase signal QS2 according to a tendency of a change in a value of the second in-phase signal IS2 may be opposite to the case of FIG. 5, which may be the forward bias case.

A calculation result of Equation 2 or Equation 4 according to a value of the second in-phase signal IS2 and a value of the second quadrature-phase signal QS2 may be implemented with a look-up table. An amplitude of a subcarrier and data signal may be simply obtained with reference to a value of the second in-phase signal IS2, a value of the second quadrature-phase signal QS2, and the look-up table.

Figure 7:
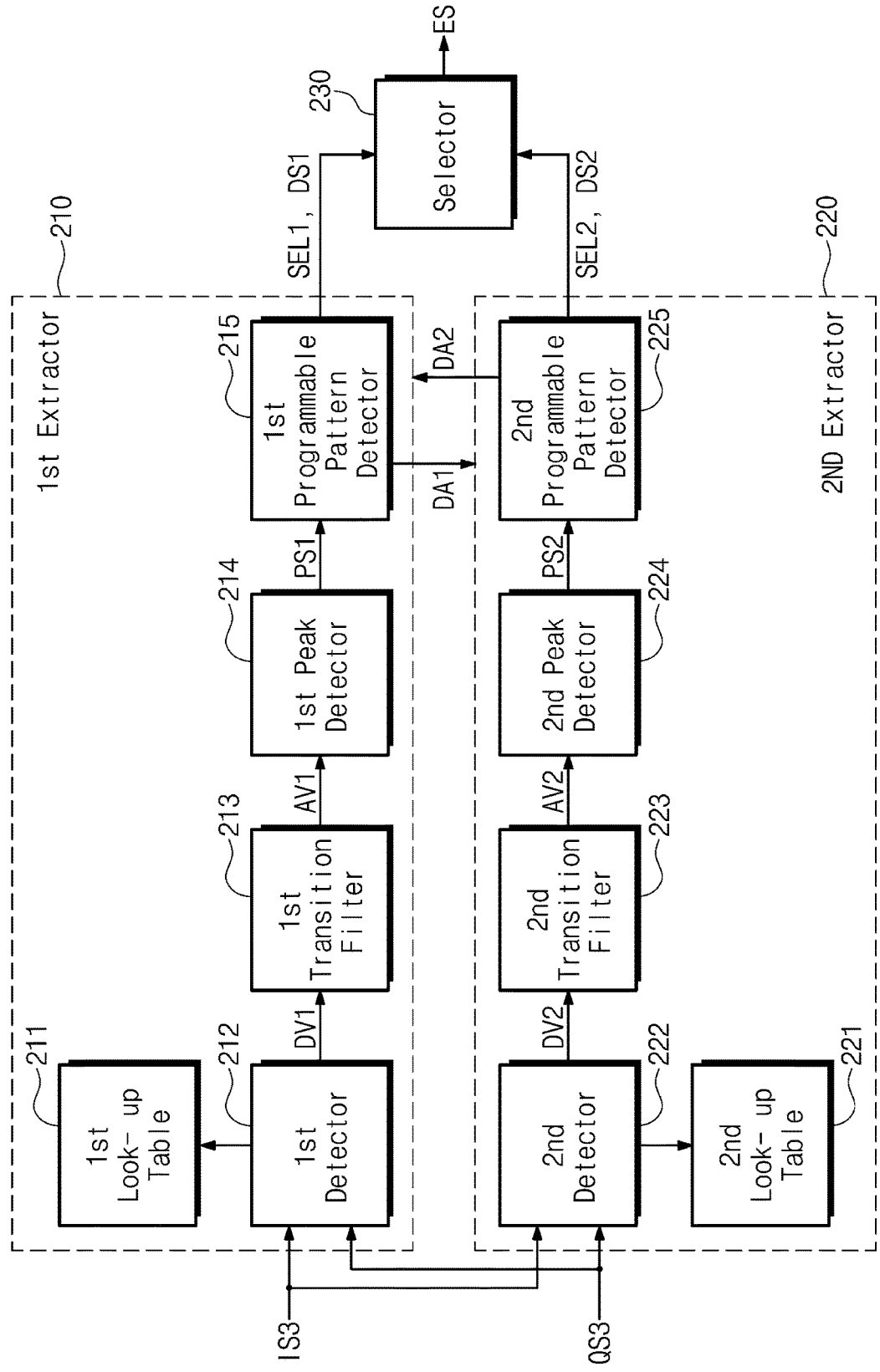
FIG. 7 illustrates a digital signal extractor according to a first embodiment.

FIG. 7 illustrates a digital signal extractor 200 according to a first embodiment. The digital signal extractor 200 may be included in the digital signal extractor 160 of FIG. 1. Referring to FIGS. 1 and 7, the digital signal extractor 200 may include a first extractor 210, a second extractor 220, and a selector 230.

The first extractor 210 may output a first digital signal DS1 indicating an amplitude of a subcarrier and data signal when the third in-phase signal IS3 and the third quadrature-phase signal QS3 correspond to a forward bias. The first extractor 210 may include a first look-up table 211, a first detector 212, a first transition filter 213, a first peak detector 214, and a first programmable pattern detector 215.

The first look-up table 211 may include results of Equation 1 or Equation 3 according to values of the third in-phase signal IS3 and the third quadrature-phase signal QS3 corresponding to the forward bias of FIG. 5.

The first detector 212 may receive the third in-phase signal IS3 and the third quadrature-phase signal QS3. The first detector 212 may detect a value of an amplitude corresponding to the third in-phase signal IS3 and the third quadrature-phase signal QS3 from the first look-up table 211. The first detector 212 may output the detected value as a first detection value DV1.

The first transition filter 213 may receive the first detection value DV1 from the first detector 212. The first transition filter 213 may be an n-tap transition filter, where n may be a positive integer. The first transition filter 213 may calculate an accumulated value, for example an accumulated sum, of "n" values sequentially received over time.

For example, "n" may be the number of periods of a subcarrier, which are included in one period of a data signal. In an embodiment, "n" may be "16". The first transition filter 213 may reduce the influence of noise. The first transition filter 213 may output a first accumulated value AV1.

The first peak detector 214 may receive the first accumulated value AV1. The first peak detector 214 may output a pulse, for example a first pulse, as a first peak signal PS1 when the first accumulated value AV1 is greater than a first offset and may output a pulse, for example a second pulse, as the first peak signal PS1 when the first accumulated value AV1 is smaller than a second offset.

The first programmable pattern detector 215 may receive the first peak signal PS1. The first programmable pattern detector 215 may perform decoding on the first peak signal PS1 and may generate a first digital signal DS1 corresponding to the subcarrier and data signal from the first peak signal PS1.

The first programmable pattern detector 215 may compare the first digital signal DS1 with a specific pattern. The specific pattern may be a pattern of the subcarrier defined by the NFC protocol. When the first digital signal DS1 corresponds to the specific pattern, the first programmable pattern detector 215 may output a first selection signal SEL1. The selector 230 may output the first digital signal DS1 as the extraction signal ES in response to the first selection signal SEL1.

When the first digital signal DS1 corresponds to the specific pattern, the first programmable pattern detector 215 may output a first deactivation signal DA1. The second extractor 220, or at least one of components of the second extractor 220, may be deactivated in response to the first deactivation signal DA1. For example, a power that is supplied to the second extractor 220 may be blocked. The second extractor 220 may be deactivated until the current communication with the NFC device is terminated.

The second extractor 220 may output a second digital signal DS2 indicating an amplitude of a subcarrier and data signal when the third in-phase signal IS3 and the third quadrature-phase signal QS3 correspond to a reverse bias. The second extractor 220 may include a second look-up table 221, a second detector 222, a second transition filter 223, a second peak detector 224, and a second programmable pattern detector 225.

The second look-up table 221 may include results of Equation 2 or Equation 4 according to values of the third in-phase signal IS3 and the third quadrature-phase signal QS3 corresponding to the reverse bias of FIG. 6.

The second detector 222 may receive the third in-phase signal IS3 and the third quadrature-phase signal QS3. The second detector 222 may detect a value of an amplitude corresponding to the third in-phase signal IS3 and the third quadrature-phase signal QS3 from the second look-up table 221. The second detector 222 may output the detected value as a second detection value DV2.

The second transition filter 223 may receive the second detection value DV2 from the second detector 222. The second transition filter 223 may be an n-tap transition filter. The second transition filter 223 may calculate an accumulated value, for example an accumulated sum, of "n" values sequentially received over time. The second transition filter 223 may output a second accumulated value AV2.

The second peak detector 224 may receive the second accumulated value AV2. The second peak detector 224 may output a pulse, for example a third pulse, as a second peak signal PS2 when the second accumulated value AV2 is greater than the second offset and may output a pulse, for example a fourth pulse, as the second peak signal PS2 when the second accumulated value AV2 is smaller than the second offset.

The second programmable pattern detector 225 may receive the second peak signal PS2. The second programmable pattern detector 225 may perform decoding on the second peak signal PS2 and may generate a second digital signal DS2 corresponding to the subcarrier and data signal from the second peak signal PS2.

The second programmable pattern detector 225 may compare the second digital signal DS2 with the specific pattern. The specific pattern may be a pattern of the subcarrier defined by the NFC protocol. When the second digital signal DS2 corresponds to the specific pattern, the second programmable pattern detector 225 may output a second selection signal SEL2. The selector 230 may output the second digital signal DS2 as the extraction signal ES in response to the second selection signal SEL2.

When the second digital signal DS2 corresponds to the specific pattern, the second programmable pattern detector 225 may output a second deactivation signal DA2. The first extractor 210, or at least one of components of the first extractor 210, may be deactivated in response to the second deactivation signal DA2. For example, a power that is supplied to the first extractor 210 may be blocked. The first extractor 210 may be deactivated until the current communication with the NFC device is terminated.

In an embodiment, when the first selection signal SEL1 is not received from the first extractor 210 and the second selection signal SEL2 is not received from the second extractor 220, the selector 230 may not output the extraction signal ES.

FIG. 8 illustrates an example of a first look-up table. Referring to FIGS. 5, 7, and 8, the second in-phase signal IS2 and the second quadrature-phase signal QS2 have the same polarity. As a value of the in-phase element "I", which may be the third in-phase signal IS3, increases and a value of the quadrature-phase element "Q", which may be the third quadrature-phase signal QS3, increases, the first detection value DV1 may increase.

Likewise, as a value of the in-phase element "I", which may be the third in-phase signal IS3, decreases and a value of the quadrature-phase element "Q", which may be the third quadrature-phase signal QS3, decreases, the first detection value DV1 may decrease.

FIG. 9 illustrates an example of a second look-up table. Referring to FIGS. 6, 7, and 9, the second in-phase signal IS2 and the second quadrature-phase signal QS2 have opposite polarities. As a value of the in-phase element "I", which may be the third in-phase signal IS3, increases and a value of the quadrature-phase element "Q", which may be the third quadrature-phase signal QS3, decreases, the second detection value DV2 may increase.

Likewise, as a value of the in-phase element "I", which may be the third in-phase signal IS3, decreases and a value of the quadrature-phase element "Q", which may be the third quadrature-phase signal QS3, increases, the second detection value DV2 may decrease.

Figure 10:
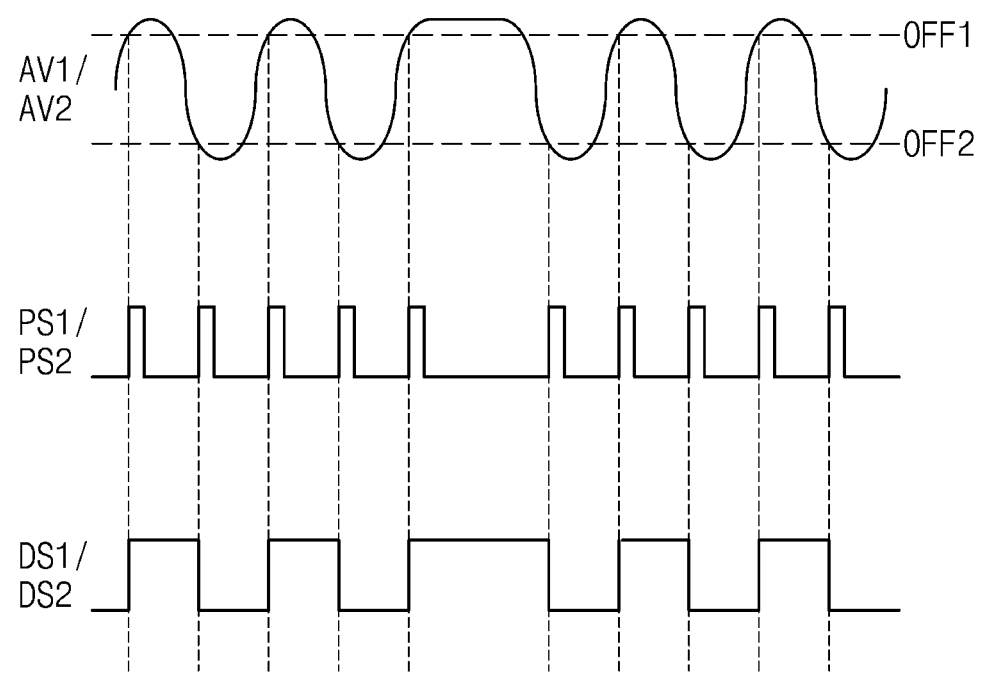
FIG. 10 illustrates an example in which signals are processed within a programmable pattern detector, according to an embodiment.

FIG. 10 illustrates an example in which signals are processed within the first or second programmable pattern detector 215 or 225. Referring to FIGS. 7 and 10, an exemplary waveform of the first accumulated value AV1 or the second accumulated value AV2 is illustrated. The first or second peak detector 214 or 224 may compare the accumulated value AV1 or AV2 with a first offset OFF1 and a second offset OFF2. The first offset OFF1 may be higher in voltage level than the second offset OFF2.

The first or second peak detector 214 or 224 may output a pulse as the peak signal PS1 or PS2 when the accumulated value AV1 or AV2 is greater than the first offset OFF1. The peak detector 214 or 224 may output a pulse as the peak signal PS1 or PS2 when the accumulated value AV1 or AV2 is less than the second offset OFF2.

In an embodiment, the pulse, for example a first pulse, generated by the first offset OFF1 and the pulse, for example a second pulse, generated by the second offset OFF2 may be distinguishable. For example, the first pulse and the second pulse may be transmitted through different signal lines. The first pulse and the second pulse may be distinguishable by the order of generation.

The first or second programmable pattern detector 215 or 225 may decode the peak signal PS1 or PS2 to generate the digital signal DS1 or DS2. In response to the pulse generated by the first offset OFF1, the first or second programmable pattern detector 215 or 225 may allow the digital signal DS1 or DS to transition from a low level to a high level.

In response to the pulse generated by the second offset OFF2, the first or second programmable pattern detector 215 or 225 may allow the digital signal DS1 or DS to transition from the high level to the low level. The digital signal DS1 or DS2 may be a mix of the subcarrier and data signal.

Figure 11:
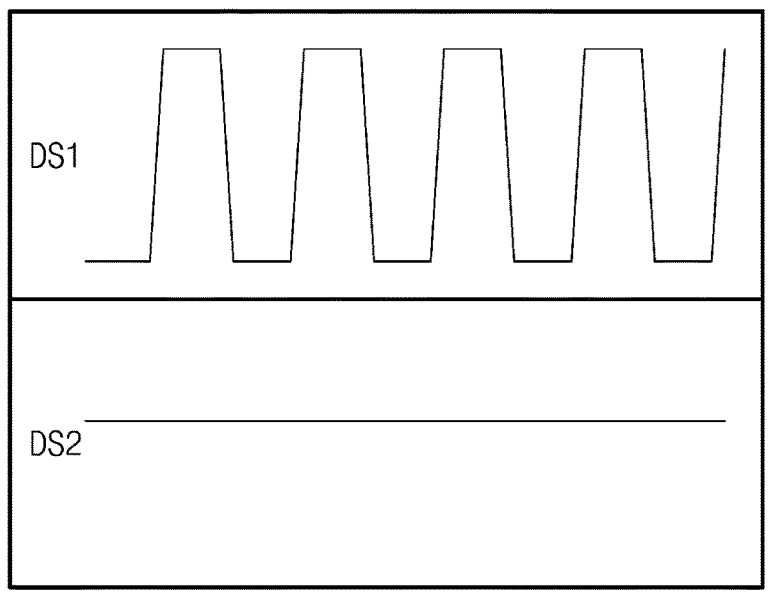
FIG. 11 illustrates an example of a first digital signal and a second digital signal when a second in-phase signal and a second quadrature-phase signal correspond to a forward bias, according to an embodiment.

FIG. 11 illustrates an example of the first digital signal DS1 and the second digital signal DS2 when the second in-phase signal IS2 and the second quadrature-phase signal QS2 correspond to a forward bias. In an embodiment illustrated in FIG. 11, the first digital signal DS1 may show a subcarrier and data signal. In contrast, the second digital signal DS2 may have a flat value ideally and may appear as values in which various noises are substantially included.

Figure 12:
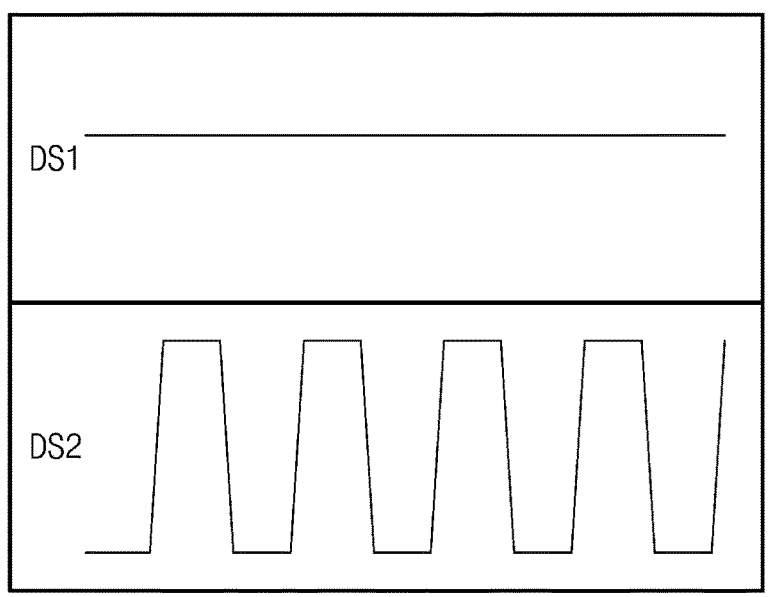
FIG. 12 illustrates an example of a first digital signal and a second digital signal when a second in-phase signal and a second quadrature-phase signal correspond to a reverse bias, according to an embodiment.

FIG. 12 illustrates an example of the first digital signal DS1 and the second digital signal DS2 when the second in-phase signal IS2 and the second quadrature-phase signal QS2 correspond to a reverse bias. In an embodiment illustrated in FIG. 12, the second digital signal DS2 may show a subcarrier and data signal. In contrast, the first digital signal DS1 may have a flat value ideally and may appear as values in which various noises are substantially included.

Figure 13:
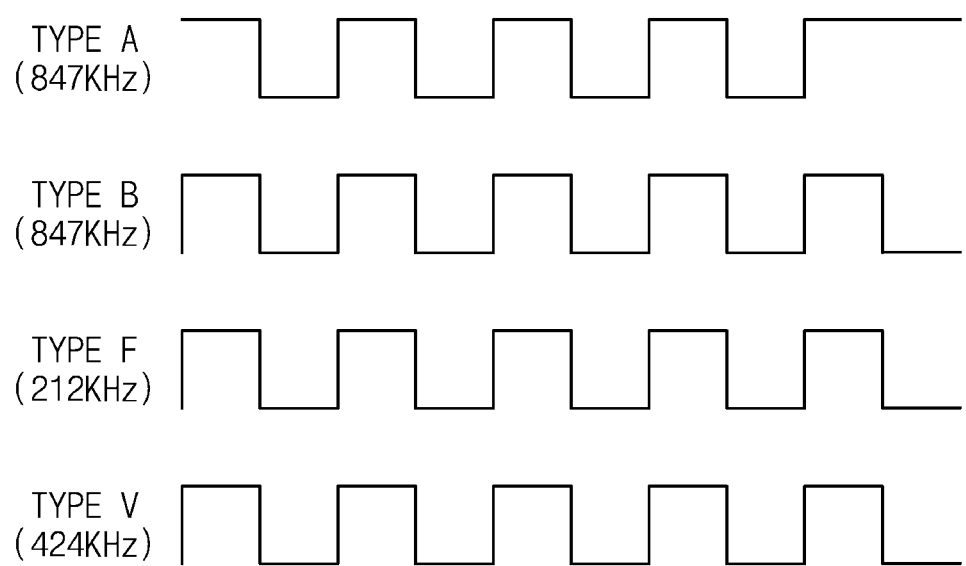
FIG. 13 illustrates an example of patterns of a subcarrier defined by an NFC protocol, according to an embodiment.

FIG. 13 illustrates an example of patterns of a subcarrier defined by an NFC protocol. Referring to FIG. 13, when an illustrated pattern corresponding to NFC Type A is received as much as 3, the first or second programmable pattern detector 215 or 225 may determine whether the digital signal DS1 or DS2 corresponds to a pattern of the NFC Type A. The first or second programmable pattern detector 215 or 225 may output the selection signal SEL1 or SEL2 and the deactivation signal DA1 or DA2 based on this determination.

When an illustrated pattern corresponding to NFC Type B is received as much as 4 or more, the first or second programmable pattern detector 215 or 225 may determine whether the digital signal DS1 or DS2 corresponds to a pattern of the NFC Type B. The first or second programmable pattern detector 215 or 225 may output the selection signal SEL1 or SEL2 and the deactivation signal DA1 or DA2 based on this determination.

When an illustrated pattern corresponding to NFC Type F is received as much as 4 or more, the first or second programmable pattern detector 215 or 225 may determine whether the digital signal DS1 or DS2 corresponds to a pattern of the NFC Type F. The first or second programmable pattern detector 215 or 225 may output the selection signal SEL1 or SEL2 and the deactivation signal DA1 or DA2 based on this determination.

When an illustrated pattern corresponding to NFC Type V is received as much as a value between 4 and 8, the first or second programmable pattern detector 215 or 225 may determine whether the digital signal DS1 or DS2 corresponds to a pattern the NFC Type V. The first or second programmable pattern detector 215 or 225 may output the selection signal SEL1 or SEL2 and the deactivation signal DA1 or DA2 based on this determination.

As described above, the NFC device 100 according to an embodiment may implement amplitude calculations by using simple digital circuits by storing amplitude values according to an in-phase element and a quadrature-phase element in the form of a table. Accordingly, the size, complexity, costs, and power consumption of the NFC device 100 may be reduced.

Also, the NFC device 100 according to an embodiment may not calculate a phase from an in-phase element and a quadrature-phase element. The influence of phase may be applied only to a determination of forward bias and reverse bias in the ASK-based NFC accompanying a subcarrier. The NFC device 100 may include look-up tables respectively corresponding to the forward bias and the reverse bias separately and replace phase calculation with selecting one of the look-up tables. Accordingly, the size, complexity, costs, and power consumption of the NFC device 100 may be reduced.

Figure 14:
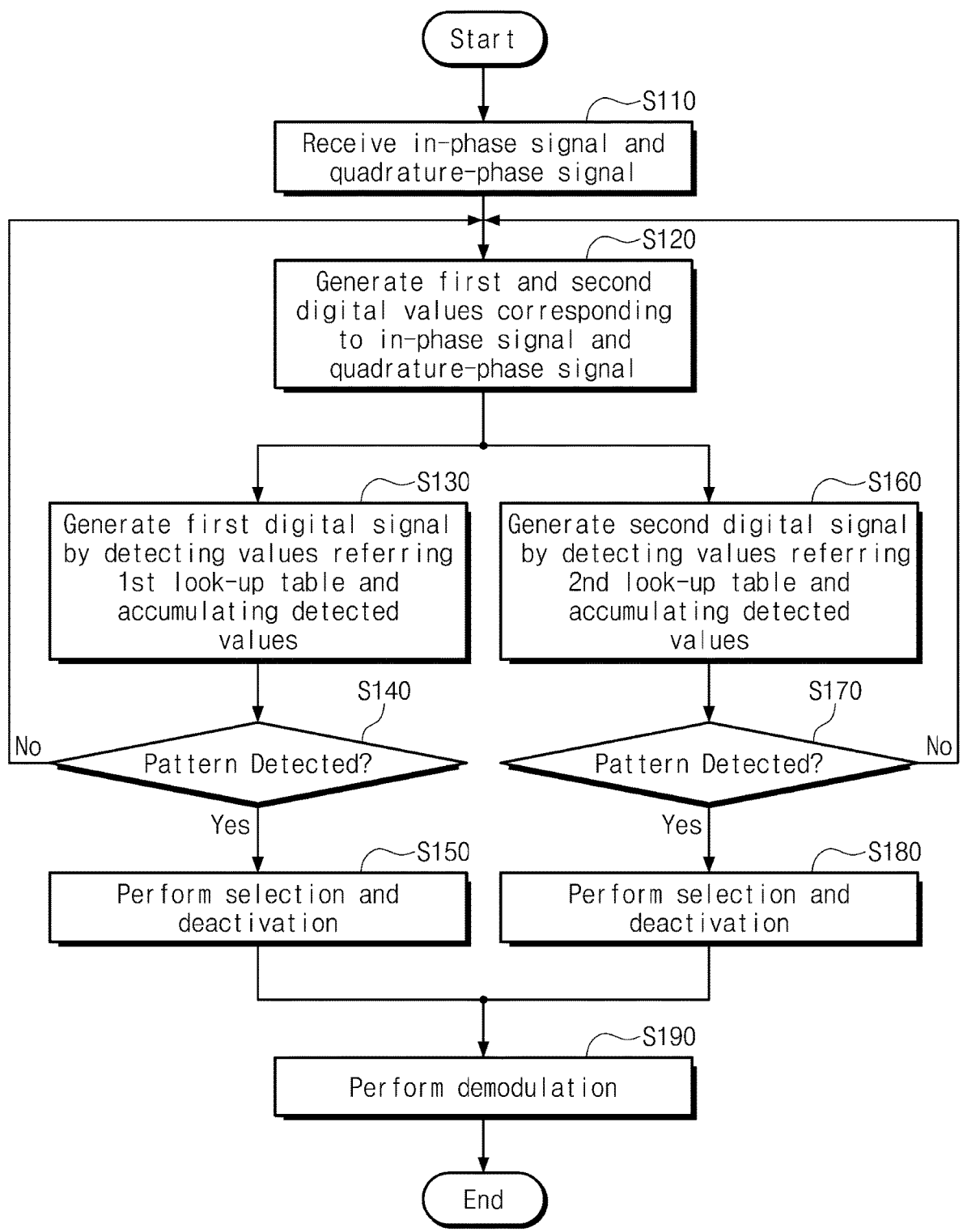
FIG. 14 illustrates another operating method according to a first embodiment of an NFC device, according to an embodiment.

FIG. 14 illustrates an operating method according to a first embodiment of the NFC device 100. Referring to FIGS. 1, 7, and 14, in operation S110, the first ADC 151 and the second ADC 153 of the NFC device 100 may receive an in-phase signal, for example IS2, and a quadrature-phase signal, for example QS2, respectively.

In operation S120, the first ADC 151 and the second ADC 153 may generate first digital values for example values of the third in-phase signal IS3, and second digital values, for example values of the third quadrature-phase signal QS3, corresponding to the second in-phase signal IS2 and the second quadrature-phase signal QS2.

Operation S130 to operation S150 may correspond to an operation of the first extractor 210. In operation S130, the first extractor 210 may generate the first digital signal DS1 by detecting values, for example the first detection values DV1, with reference to the first look-up table 211 and accumulating the detected values.

In operation S140, the programmable pattern detector 215 of the first extractor 210 may determine whether a pattern of a subcarrier according to the NFC protocol is detected from the first digital signal DS1. Until the subcarrier pattern is detected, the first extractor 210 may repeatedly perform operation S130 and operation S140.

When the subcarrier pattern is detected, in operation S150, the first extractor 210 may output the first selection signal SEL1 such that the first digital signal DS1 is selected and may output the first deactivation signal DA1 such that the second extractor 220 is deactivated.

Operation S160 to operation S180 may correspond to an operation of the second extractor 220. In operation S160, the second extractor 220 may generate the second digital signal DS2 by detecting values, for example the second detection values DV2, with reference to the second look-up table 221 and accumulating the detected values.

In operation S170, the second programmable pattern detector 225 of the second extractor 220 may determine whether a pattern of a subcarrier according to the NFC protocol is detected from the second digital signal DS2. Until the subcarrier pattern is detected, the second extractor 220 may repeatedly perform operation S160 and operation S170.

When the subcarrier pattern is detected, in operation S180, the second extractor 220 may output the second selection signal SEL2 such that the second digital signal DS2 is selected and may output the second deactivation signal DA2 such that the first extractor 210 is deactivated.

When one of the first digital signal DS1 and the second digital signal DS2 is selected as the extraction signal ES, in operation S190, the modem 170 may perform NFC protocol-based demodulation, or subcarrier demodulation, on the extraction signal ES.

Figure 15:
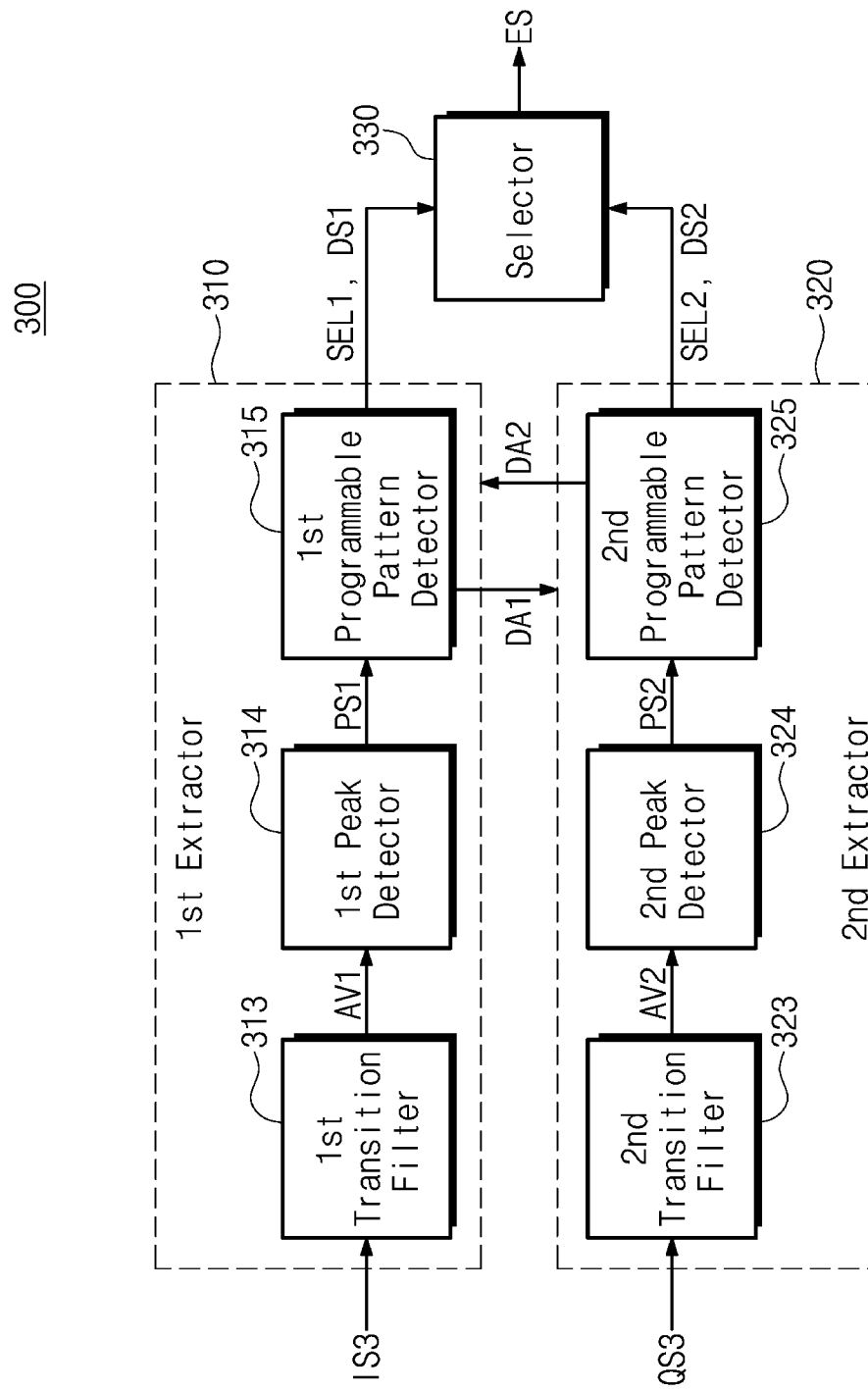
FIG. 15 illustrates a digital signal extractor according to a second embodiment, according to an embodiment.

FIG. 15 illustrates a digital signal extractor 300 according to a second embodiment. The digital signal extractor 300 may be included in the digital signal extractor 160 of FIG. 1. Referring to FIGS. 1 and 15, the digital signal extractor 300 may include a first extractor 310, a second extractor 320, and a selector 330.

The first extractor 310 may output an amplitude of the third in-phase signal IS3 as the first digital signal DS1. The first extractor 310 may include a first transition filter 313, a first peak detector 314, and a first programmable pattern detector 315.

The first transition filter 313 may receive the third in-phase signal IS3. The first transition filter 313 may be an n-tap transition filter, where n is a positive integer. The first transition filter 313 may calculate an accumulated value, for example an accumulated sum, of "n" values sequentially received over time. The first transition filter 313 may output the first accumulated value AV1.

The first peak detector 314 may receive the first accumulated value AV1. The first peak detector 314 may output a pulse, for example a first pulse, as a first peak signal PS1 when the first accumulated value AV1 is greater than the first offset and may output a pulse, for example a second pulse, as the first peak signal PS1 when the first accumulated value AV1 is smaller than the second offset.

The first programmable pattern detector 315 may receive the first peak signal PS1. The first programmable pattern detector 315 may perform decoding on the first peak signal PS1 and may generate a first digital signal DS1 corresponding to the subcarrier and data signal from the first peak signal PS1.

The first programmable pattern detector 315 may compare the first digital signal DS1 with a specific pattern. The specific pattern may be a pattern of the subcarrier defined by the NFC protocol. When the first digital signal DS1 corresponds to the specific pattern, the first programmable pattern detector 315 may output the first selection signal SEL1. The selector 330 may output the first digital signal DS1 as the extraction signal ES in response to the first selection signal SEL1.

When the first digital signal DS1 corresponds to the specific pattern, the first programmable pattern detector 315 may output the first deactivation signal DA1. The second extractor 320, or at least one of components of the second extractor 320, may be deactivated in response to the first deactivation signal DA1. For example, a power that is supplied to the second extractor 320 may be blocked. The second extractor 320 may be deactivated until the current communication with the NFC device is terminated.

The second extractor 320 may output an amplitude of the third quadrature-phase signal QS3 as the second digital signal DS2. The second extractor 320 may include a second transition filter 323, a second peak detector 324, and a second programmable pattern detector 325.

The second transition filter 323 may receive the third quadrature-phase signal QS3. The second transition filter 323 may be an n-tap transition filter. The second transition filter 323 may calculate an accumulated value, for example an accumulated sum, of "n" values sequentially received over time. The second transition filter 323 may output the second accumulated value AV2.

The second peak detector 324 may receive the second accumulated value AV2. The second peak detector 324 may output a pulse, for example a third pulse, as the second peak signal PS2 when the second accumulated value AV2 is greater than the second offset and may output a pulse, for example a fourth pulse, as the second peak signal PS2 when the second accumulated value AV2 is smaller than the second offset.

The second programmable pattern detector 325 may receive the second peak signal PS2. The second programmable pattern detector 325 may perform decoding on the second peak signal PS2 and may generate a second digital signal DS2 corresponding to the subcarrier and data signal from the second peak signal PS2.

The second programmable pattern detector 325 may compare the second digital signal DS2 with the specific pattern. The specific pattern may be a pattern of the subcarrier defined by the NFC protocol. When the second digital signal DS2 corresponds to the specific pattern, the second programmable pattern detector 325 may output the second selection signal SEL2. The selector 330 may output the second digital signal DS2 as the extraction signal ES in response to the second selection signal SEL2.

When the second digital signal DS2 corresponds to the specific pattern, the second programmable pattern detector 325 may output the second deactivation signal DA2. The first extractor 310, or at least one of components of the first extractor 310, may be deactivated in response to the second deactivation signal DA2. For example, a power that is supplied to the first extractor 310 may be blocked. The first extractor 310 may be deactivated until the current communication with the NFC device is terminated.

In an embodiment, when the first selection signal SEL1 is not received from the first extractor 310 and the second selection signal SEL2 is not received from the second extractor 320, the selector 330 may not output the extraction signal ES.

In general, in the case of restoring an original signal, for example a data signal and a subcarrier signal, based on one selected from an in-phase signal and a quadrature-phase signal, selection is made only by using the magnitudes of amplitudes of the in-phase signal and the quadrature-phase signal. This selection scheme may cause a decrease of accuracy and a decrease of the reliability of communication. In particular, this selection scheme may be more vulnerable when a strong noise is included in one of an in-phase signal and a quadrature-phase signal.

The digital signal extractor 300 according to an embodiment may select one of an in-phase signal and a quadrature-phase signal based on whether any signal includes a pattern, for example subcarrier pattern, defined by the NFC protocol, not a magnitude of an amplitude. Accordingly, the accuracy of selection may be improved, and the reliability of communication may be improved.

Figure 16:
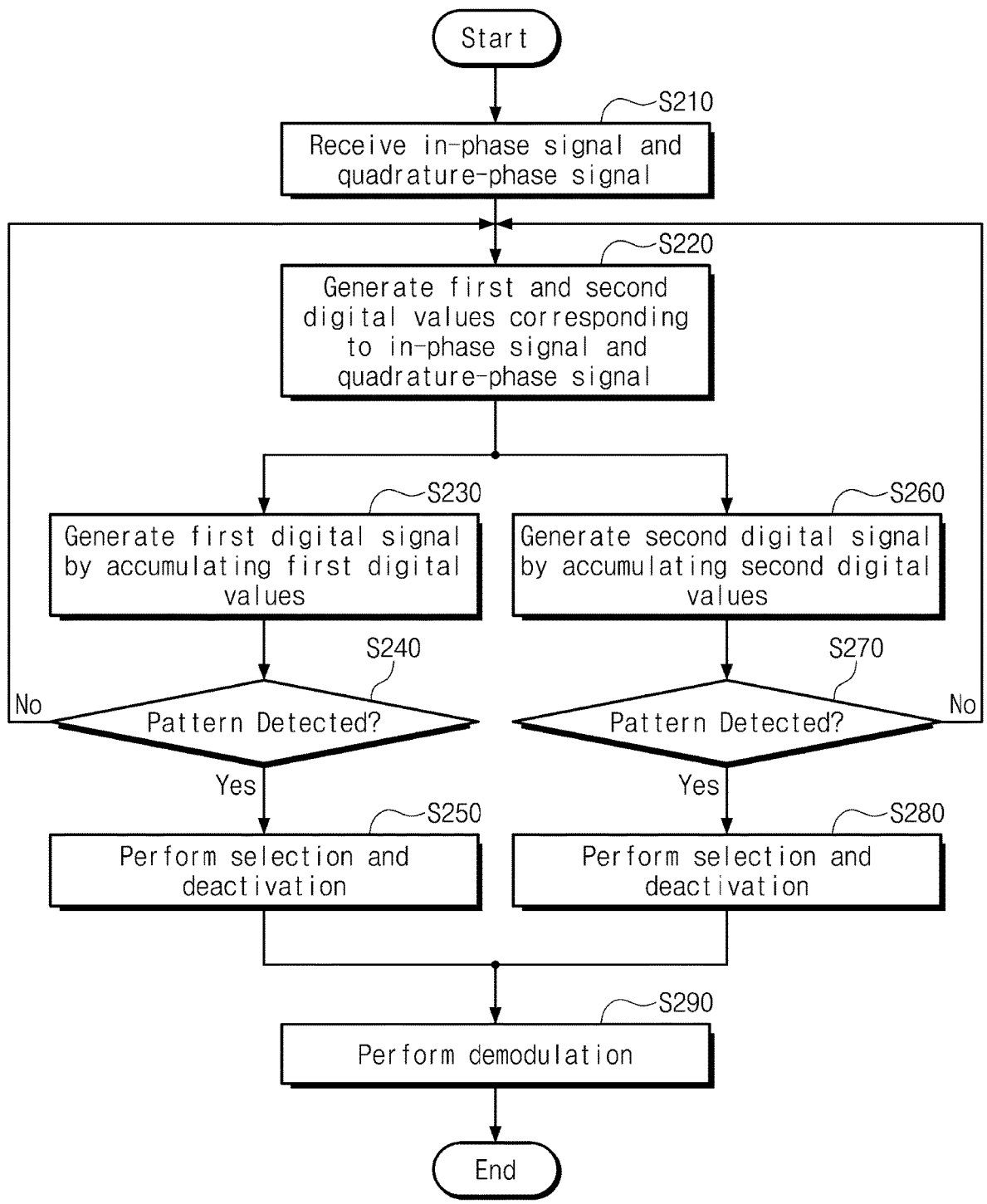
FIG. 16 illustrates an operating method according to a second embodiment of an NFC device, according to an embodiment.

FIG. 16 illustrates an operating method according to a second embodiment of the NFC device 100. Referring to FIGS. 1, 7, and 16, in operation S210, the first ADC 151 and the second ADC 153 of the NFC device 100 may receive an in-phase signal, for example IS2, and a quadrature-phase signal, for example QS2, respectively.

In operation S220, the first ADC 151 and the second ADC 153 may generate first digital values, for example values of the third in-phase signal IS3, and second digital values, for example values of the third quadrature-phase signal QS3, corresponding to the second in-phase signal IS2 and the second quadrature-phase signal QS2.

Operation S230 to operation S250 may correspond to an operation of the first extractor 310. In operation S230, the first extractor 310 may generate the first digital signal DS1 by accumulating values of the third in-phase signal IS3.

In operation S240, the first programmable pattern detector 315 of the first extractor 310 may determine whether a pattern of a subcarrier according to the NFC protocol is detected from the first digital signal DS1. Until the subcarrier pattern is detected, the first extractor 310 may repeatedly perform operation S230 and operation S240.

When the subcarrier pattern is detected, in operation S250, the first extractor 310 may output the first selection signal SEL1 such that the first digital signal DS1 is selected and may output the first deactivation signal DA1 such that the second extractor 320 is deactivated.

Operation S260 to operation S280 may correspond to an operation of the second extractor 320. In operation S260, the second extractor 320 may generate the second digital signal DS2 by accumulating values of the third quadrature-phase signal QS3.

In operation S270, the second programmable pattern detector 325 of the second extractor 320 may determine whether a pattern of a subcarrier according to the NFC protocol is detected from the second digital signal DS2. Until the subcarrier pattern is detected, the second extractor 320 may repeatedly perform operation S260 and operation S270.

When the subcarrier pattern is detected, in operation S280, the second extractor 320 may output the second selection signal SEL2 such that the second digital signal DS2 is selected and may output the second deactivation signal DA2 such that the first extractor 310 is deactivated.

When one of the first digital signal DS1 and the second digital signal DS2 is selected as the extraction signal ES, in operation S290, the modem 170 may perform NFC protocol-based demodulation, or subcarrier demodulation, on the extraction signal ES.

Figure 17:
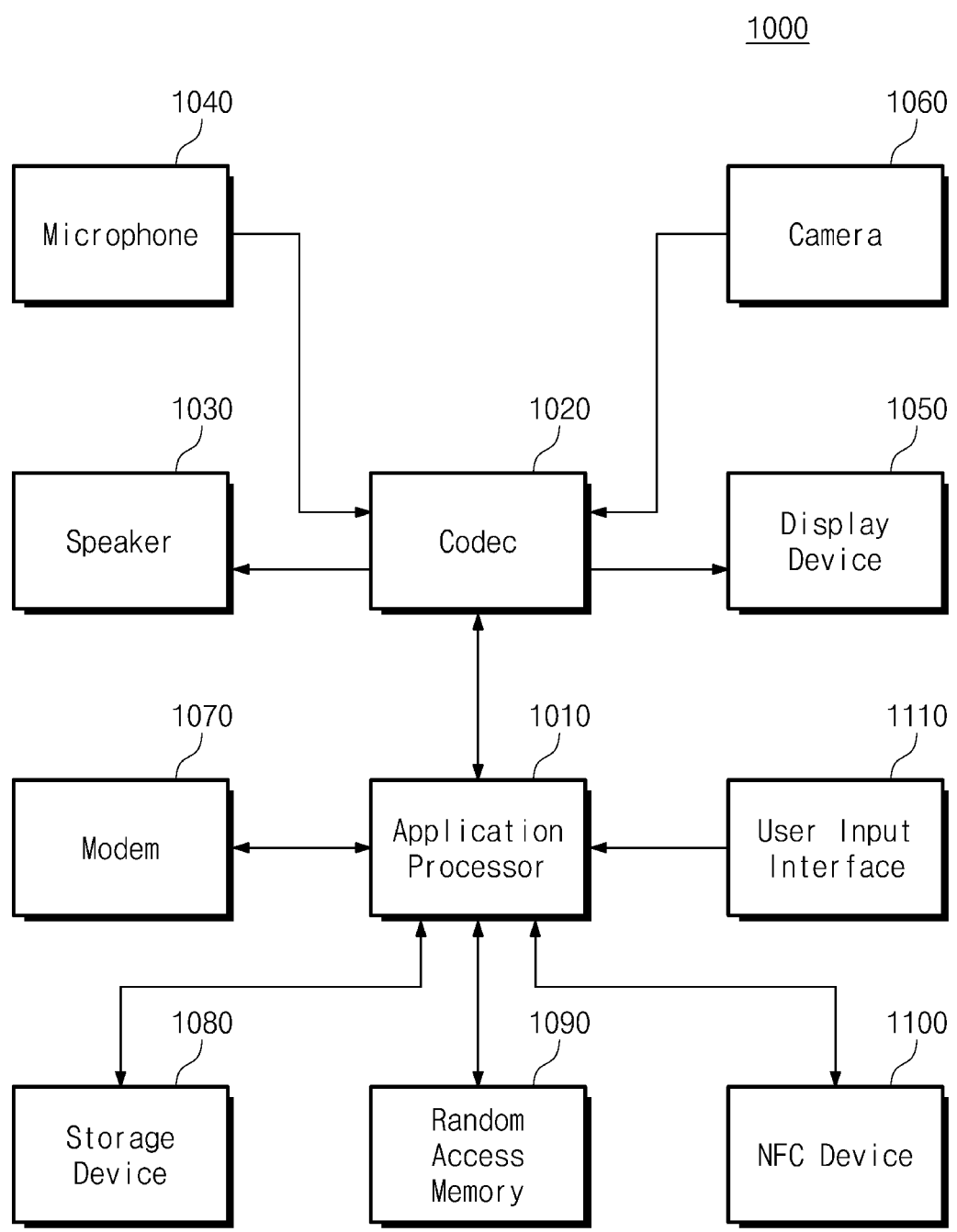
FIG. 17 is a block diagram illustrating a mobile device, according to an embodiment.

FIG. 17 is a block diagram illustrating a mobile device 1000 according to an embodiment. Referring to FIG. 17, the mobile device 1000 includes an application processor 1010, a codec 1020, a speaker 1030, a microphone 1040, a display device 1050, a camera 1060, a modem 1070, a storage device 1080, a random access memory 1090, and an NFC device 1100.

The application processor 1010 may drive an operating system for operating the mobile device 1000 and may drive various applications on the operating system. The codec 1020 may perform coding and decoding on a voice signal or an image signal. The codec 1020 may perform a task, which is associated with processing a voice signal or an image signal, while the task is delegated from the application processor.

The speaker 1030 may play a voice signal transferred from the codec 1020. The microphone 1040 may detect sound from the outside, for example the outside of the mobile device 1000, may convert the detected sound into an electrical voice signal, and may output the voice signal to the codec 1020. The display device 1050 may play am image signal transferred from the codec 1020. The camera 1060 may convert a scene in a field of vision into an electrical image signal and may output the image signal to the codec 1020.

The modem 1070 may communicate with an external device using wires or wirelessly. The modem 1070 may transfer data to an external device in response to a request of the application processor 1010 or may request data from the external device. The storage device 1080 may be main storage of the mobile device 1000.

The storage device 1080 may be used to store data for a long time and may retain data stored therein even though power is removed. The random access memory 1090 may be used as a main memory of the mobile device 1000. The random access memory 1090 may be used for master devices, such as the application processor 1010, the modem 1070, the codec 1020, etc. to temporarily store data.

The NFC device 1100 may correspond to the NFC device 100 described with reference to FIGS. 1 to 16. The NFC device 1100 may operate as a reader or a card. When operating as a reader, the NFC device 1100 may extract a subcarrier and data signal as the extraction signal ES by using the digital signal extractor 200 illustrated in FIG. 7 or the digital signal extractor 300 illustrated in FIG. 15. Accordingly, the size, complexity, costs, and power consumption of the NFC device 1100 may be reduced.

An user input interface 1110 may include various devices that receive inputs from a user. For example, the user input interface 1110 may include devices, which receive an input directly from a user, such as a touch panel, a touch screen, a button, and a key pad or devices, which indirectly receive results generated by actions of the user, such as an optical sensor, a proximity sensor, a gyroscope sensor, and a pressure sensor.

In the above embodiments, components of the NFC device 100 are described by using the terms "first", "second", "third", and the like. However, the terms "first", "second", "third", and the like may be used to distinguish components from each other and do not limit the inventive concept. For example, the terms "first", "second", "third", and the like do not involve an order or a numerical meaning of any form.

In the above embodiments, components according to embodiments are described by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to the inventive concept, a near field communication device may extract data from a wireless signal by generating signals from the wireless signal by using look-up tables that are based a relationship between an in-phase signal and a quadrature-phase signal, comparing the signals with a pattern defined by the near field communication protocol, and selecting one of the signals depending on a result of the comparison. Also, the near field communication device may extract data from a wireless signal by comparing an in-phase signal and a quadrature-phase signal with the pattern defined by the near field communication protocol and selecting one of the signals depending on a result of the comparison. The procedure of extracting data is implemented by using simple digital circuits. Accordingly, a near field communication device having reduced size, costs, and power consumption and an operating method of the near field communication device are provided.

While the inventive concept has been described with reference to exemplary embodiments thereof, it will be apparent to those of ordinary skill in the art that various changes and modifications may be made thereto without departing from the spirit and scope as set forth in the following claims.

What is claimed is:

1. A near field communication device, comprising:
a matching circuit connected to an antenna, and including at least one from among a capacitor and an inductor;
a local oscillator configured to generate a first oscillation signal and a second oscillation signal that is 90 degrees out of phase with the first oscillation signal;
a first mixer configured to receive a signal from the antenna through the matching circuit, to receive the first oscillation signal from the local oscillator, and to generate a first in-phase signal by multiplying the signal with the first oscillation signal;
a second mixer configured to receive the signal from the antenna through the matching circuit, to receive the second oscillation signal from the local oscillator, and to generate a first quadrature-phase signal by multiplying the signal with the second oscillation signal;
a first low-pass filter configured to generate a second in-phase signal by filtering the first in-phase signal;
a second low-pass filter configured to generate a second quadrature-phase signal by filtering the first quadrature-phase signal;
a first analog-to-digital converter configured to generate a third in-phase signal by converting the second in-phase signal;
a second analog-to-digital converter configured to generate a third quadrature-phase signal by converting the second quadrature-phase signal;
a digital signal extractor configured to:
  receive the third in-phase signal and the third quadrature-phase signal,
  generate a first signal based on the third in-phase signal and the third quadrature-phase signal with reference to a first look-up table, and
  generate a second signal based on the third in-phase signal and the third quadrature-phase signal with reference to a second look-up table,
  select one from among the first signal and the second signal based on a comparison between the first signal and a signal pattern, and a comparison between the second signal and the signal pattern, and
  output the selected one from among the first signal and the second signal as an extraction signal; and
a modem configured to receive the extraction signal and to demodulate the extraction signal.

2. The near field communication device of claim 1, wherein the signal pattern includes a pattern of a subcarrier defined by a near field communication protocol.

3. The near field communication device of claim 1, wherein the first look-up table includes values of an amplitude of the signal arranged according to values of the third in-phase signal and values of the third quadrature-phase signal, and
wherein in the first look-up table, the values of the third quadrature-phase signal decrease as the values of the third in-phase signal increase.

4. The near field communication device of claim 1, wherein the second look-up table includes values of an amplitude of the signal according to values of the third in-phase signal and values of the third quadrature-phase signal, and
wherein in the second look-up table, the values of the third quadrature-phase signal decrease as the values of the third in-phase signal increase.

5. The near field communication device of claim 1, wherein based on a value of the third quadrature-phase signal increasing as a value of the third in-phase signal increases, the digital signal extractor is further configured to select the first signal, and to output the first signal as the extraction signal.

6. The near field communication device of claim 1, wherein, based on a value of the third quadrature-phase signal decreasing as a value of the third in-phase signal increases, the digital signal extractor is further configured to select the second signal, and to output the second signal as the extraction signal.

7. The near field communication device of claim 1, wherein the digital signal extractor includes:
first storage configured to store the first look-up table;
second storage configured to store the second look-up table;

a first detector configured to detect a first detection value corresponding to a value of the third in-phase signal and a value of the third quadrature-phase signal from the first look-up table; and a second detector configured to detect a second detection value corresponding to the value of the third in-phase signal and the value of the third quadrature-phase signal from the second look-up table.

8. The near field communication device of claim 7, wherein the digital signal extractor further includes:

a first transition filter configured to accumulate a predetermined number of instances of the first detection value and to output a first accumulated value; and a second transition filter configured to accumulate the predetermined number of instances of the second detection value and to output a second accumulated value.

9. The near field communication device of claim 8, wherein the digital signal extractor further includes:

a first peak detector configured to output a first peak signal including first pulses based on the first accumulated value being greater than a first offset, and to output second pulses based on the first accumulated value being smaller than a second offset; and a second peak detector configured to output a second peak signal including third pulses based on the second accumulated value being greater than the first offset, and to output fourth pulses based on the second accumulated value being smaller than the second offset.

10. The near field communication device of claim 9, wherein the digital signal extractor further includes:

a first pattern detector configured to generate the first signal, wherein the first signal transitions from a low level to a high level based on the first pulses of the first peak signal and transitions from the high level to the low level based on the second pulses of the first peak signal, and to output the first signal as the extraction signal based on detecting that the first signal corresponds to the signal pattern; and a second pattern detector configured to generate the second signal, wherein the second signal transitions from the low level to the high level based on the third pulses of the second peak signal and transitions from the high level to the low level based on the fourth pulses of the second peak signal, and to output the second signal as the extraction signal based on detecting that the second signal corresponds to the signal pattern.

11. The near field communication device of claim 10, wherein, based on the first signal being output as the extraction signal, the first pattern detector is further configured to deactivate at least one from among the second detector, the second transition filter, the second peak detector, and the second pattern detector, and wherein, based on the second signal being output as the extraction signal, the second pattern detector is further configured to deactivate at least one of the first detector, the first transition filter, the first peak detector, and the first pattern detector.

12. The near field communication device of claim 1, wherein, based on the first signal being output as the extraction signal, the digital signal extractor is further configured to deactivate an operation of generating the second signal, and wherein, based on the second signal being output as the extraction signal, the digital signal extractor is further configured to deactivate an operation of generating the first signal.

13. A near field communication device comprising:

an antenna;

a matching circuit connected to the antenna, and including at least one capacitor and at least one inductor;

a local oscillator configured to generate a first oscillation signal, and a second oscillation signal that is 90 degrees out of phase with the first oscillation signal;

a first mixer configured to receive a signal from the antenna and the matching circuit, to receive the first oscillation signal from the local oscillator, and to generate a first in-phase signal by multiplying the signal with the first oscillation signal;

a second mixer configured to receive the signal from the antenna and the matching circuit, to receive the second oscillation signal from the local oscillator, and to generate a first quadrature-phase signal by multiplying the signal with the second oscillation signal;

a first low-pass filter configured to generate a second in-phase signal by filtering the first in-phase signal;

a second low-pass filter configured to generate a second quadrature-phase signal by filtering the first quadrature-phase signal;

a first analog-to-digital converter configured to generate a third in-phase signal by converting the second in-phase signal;

a second analog-to-digital converter configured to generate a third quadrature-phase signal by converting the second quadrature-phase signal;

a digital signal extractor configured to:
receive the third in-phase signal and the third quadrature-phase signal,
select one from among the third in-phase signal and the third quadrature-phase signal based on a comparison between the third in-phase signal and a signal pattern, and a comparison between the third quadrature-phase signal and the signal pattern, and
output the selected one from among the third in-phase signal and the third quadrature-phase signal as an extraction signal; and a modem configured to receive the extraction signal and to demodulate the extraction signal.

14. The near field communication device of claim 13, wherein the digital signal extractor further includes:

a first transition filter configured to accumulate a predetermined number values of the third in-phase signal, and to output a first accumulated value; and a second transition filter configured to accumulate the predetermined number of values of the third quadrature-phase signal, and to output a second accumulated value.

15. The near field communication device of claim 14, wherein the digital signal extractor further includes:

a first peak detector configured to output a first peak signal including first pulses based on the first accumulated value being greater than a first offset, and second pulses based on the first accumulated value being smaller than a second offset; and a second peak detector configured to output a second peak signal including third pulses based on the second accumulated value being greater than the first offset and fourth pulses based on the second accumulated value being smaller than the second offset.

16. The near field communication device of claim 15, wherein the digital signal extractor further includes:

a first pattern detector configured to generate a first signal which transitions from a low level to a high level at the first pulses of the first peak signal and transitions from the high level to the low level at the second pulses of the first peak signal, and to output the first signal as the extraction signal based on detecting that the first signal corresponds to the signal pattern; and a second pattern detector configured to generate a second signal which transitions from the low level to the high level at the third pulses of the second peak signal and transitions from the high level to the low level at the fourth pulses of the second peak signal, and to output the second signal as the extraction signal based on detecting that the second signal corresponds to the signal pattern.

17. The near field communication device of claim 16, wherein, based on the first signal being output as the extraction signal, the first pattern detector is further configured to deactivate at least one of the second transition filter, the second peak detector, and the second pattern detector, and wherein, based on the second signal being output as the extraction signal, the second pattern detector is further configured to deactivate at least one of the first transition filter, the first peak detector, and the first pattern detector.

18. An operating method of a near field communication device, the method comprising:

generating an in-phase signal and a quadrature-phase signal from a wireless frequency signal;

generating a first digital value corresponding to an amplitude of the in-phase signal, and a second digital value corresponding to an amplitude of the quadrature-phase signal;

generating a first signal and a second signal corresponding to an amplitude of the wireless frequency signal based on the amplitude of the in-phase signal and the amplitude of the quadrature-phase signal;

selecting one from among the first signal and the second signal based on a comparison between the first signal and a signal pattern, and a comparison between the second signal and the signal pattern; and demodulating the selected one from among the first signal and the second signal.

19. The method of claim 18, wherein the generating of the first signal and the second signal includes:

detecting a first value corresponding to the first digital value and the second digital value from a first look-up table;

accumulating a predetermined number of instances of the first value to generate a first accumulated value;

generating the first signal from the first accumulated value;

detecting a second value corresponding to the first digital value and the second digital value from a second look-up table;

accumulating the predetermined number of instances of the second value to generate a second accumulated value; and generating the second signal from the second accumulated value.

20. The method of claim 18, wherein the generating of the first signal and the second signal includes:

accumulating a predetermined number of instances of the first digital value to generate a first accumulated value;

generating the first signal from the first accumulated value;

accumulating the predetermined number of instances of the second digital value to generate a second accumulated value; and generating the second signal from the second accumulated value.

* * * * *